United States Patent [19]

Varshney

[11] Patent Number: 4,476,546
[45] Date of Patent: Oct. 9, 1984

[54] PROGRAMMABLE ADDRESS BUFFER FOR PARTIAL PRODUCTS

[75] Inventor: Ramesh C. Varshney, San Jose, Calif.

[73] Assignee: Fairchild Camera & Instrument Corp., Mountain View, Calif.

[21] Appl. No.: 360,029

[22] Filed: Mar. 19, 1982

[51] Int. Cl.³ .................. G11C 8/00; G11C 11/34; G11C 29/00

[52] U.S. Cl. ...................................... 365/200; 365/96

[58] Field of Search ............... 365/96, 200, 201, 189, 365/230; 324/158 F; 340/653; 307/441, 463, 219

[56] References Cited

U.S. PATENT DOCUMENTS

| 4,092,733 | 5/1978 | Coontz et al. | 365/200 |
| 4,254,477 | 3/1981 | Hsia et al. | 365/200 |
| 4,376,300 | 3/1983 | Tsang | 365/200 |

Primary Examiner—Robert L. Richardson
Attorney, Agent, or Firm—Kenneth Olsen; Robert C. Colwell; Carl L. Silverman

[57] ABSTRACT

A programmable address buffer for coupling external addresses to a desired pair of internal memory addresses includes A and B address inputs 11 and 12, a B address output 15 coupled to the B address input 12, a first inverter I30 coupled to the B address input and a $\overline{B}$ address output, a first switch S2 coupled to switchably connect one of the A and B address inputs 11 and 12 to a node, an A address output coupled to the first node, a second inverter I10 connected to the first node, a third inverter I20 connected between the second node and an $\overline{A}$ output 14, and a second switch S1 coupled to the second node to switchably connect one of the first node or the second inverter I10 to the second node.

In another embodiment an electrical circuit for controlling the addressing of functional sections of a partially functional product includes a first pin 100 coupled by a first fuse $F_1$ to a first address buffer 150, and a second pin 110 coupled by a second fuse $F_5$ to a second address buffer 160, a fusible connection $F_4$ between the second pin 110 and the first buffer 150, and fusible connections $F_2$, $F_3$, $F_6$, and $F_7$ to each address buffer to connect that address buffer to either of two selected potentials corresponding to the desired state of that buffer.

18 Claims, 9 Drawing Figures

NORMAL

PROGRAMMED

PROGRAMMABLE ADDRESS BUFFER FOR PARTIAL PRODUCTS

BACKGROUND OF THE INVENTION

1. Field of the Invention

This invention relates to integrated circuits, and in particular, to apparatus for using integrated circuit memories in which one or more sections of the memory are defective, while one or more sections are functional.

2. Description of the Prior Art

One goal in developing integrated circuits is reducing the cost of components integrated on a chip. For a given process as more components are integrated onto a given chip, the chip size increases, yield decreases, and cost increases.

Phenomena which reduce the fabrication yield of integrated circuits may be broadly divided into two classes: performance failures due to changes in process parameters, and structural failures due to isolated defects. Performance failures generally ruin an entire chip, or wafer, while structural failures often yield a partially functional chip, particularly with memories, or other circuits including large numbers of identical components. For example, a structural detect in a 64k bit memory may ruin only a portion of the memory yet permit a "partial" product of 32k size to be produced.

Although potentially offering products in effect made from what would otherwise be discarded, the manufacture and sale of partial products has not been widespread because of a number of problems. The manufacturer of such devices must stock and sell different partial products as distinct products requiring different pin connections, thereby increasing overhead. The user of such devices may find it necessary to wire various sockets for the same size partial product differently, and must maintain an inventory of each partial product. Furthermore, if the manufacturer of a partial product has a shortage of one particular partial product, it may be forced to substitute products which are entirely good to maintain delivery schedules, or it may be forced to generate more partial products of the particular kind sought by increasing production. If production is increased, however, other partial products will be fabricated which may not be in demand.

SUMMARY OF THE INVENTION

It is an object of this invention to create a single type of partial product or lower density product, typically a memory, from a variety of partially defective products by providing a system in which the user of the product addresses the functional portions of the product automatically without being required to know which portions are functional. The invention enables the fabrication of a single lower density memory from a multiple of partial products taken from a higher density memory. In one embodiment apparatus for addressing four pair of functional portions of a component containing at least four portions comprises an A address input, a B address input, a B address output coupled to the B address input, a first inverter coupled to the B address input and to a $\overline{B}$ address output, a first switch coupled to switchably connect a first node with only one of the A and B address inputs, a second switch coupled to switchably connect an A address output to only one of the first node or a second node, a second inverter coupled between the first node and the second node, and a third inverter coupled between the A address output and $\overline{A}$ address output.

In another embodiment apparatus for addressing any pair of functional portions of the memory containing at least four portions comprises an A address input, a B address input, a first switch coupled to switchably connect one of the A or B address inputs to a first node, a second switch coupled to switchably connect one of the A or B address inputs to a second node, a third switch coupled to switchably connect one of the first node or a third node to an A address output, a fourth switch coupled to switchably connect one of the second node or a fourth node to a B address output, a first inverter coupled between the first and third nodes, a second inverter coupled between the second and fourth nodes, a third inverter coupled between the A address output and an $\overline{A}$ address output, and a fourth inverter coupled between the B address output and a $\overline{B}$ address output.

In another embodiment apparatus for controlling the addressing of at least two of at least four sections of the circuit comprises a first pin coupled by first fusing means to a first address buffer, a second pin coupled by second fusing means to a second address buffer, fusible means for electrically connecting each address buffer to one of two selected potentials, and means for electrically connecting the second pin to the first address buffer.

DETAILED DESCRIPTION OF THE PREFERRED EMBODIMENTS

The preferred embodiments of this invention will be described in conjunction with a 64k bit memory divided into four sections, each of 16k bits. Throughout the description it is assumed that a product of 32k bits is to be fabricated from a partially defective 64k bit chip. It will, however, be apparent throughout the description that the techniques described are equally applicable to other sizes of memories or other products, and to products having more or fewer than four sections. The term "partial product" is generally used herein to refer to a product which requires more than one address bit to address a specific section of the product, while the term "lower density product" is used to refer to a product requiring fewer address bits to address a specific section. For example, a partial product comprising two sections of a four section memory will require two address bits to select the two sections, while a lower density product will require only one address bit with the particular section selected being determined by the state of that one bit.

Table 1 below illustrates how the state of two address lines or addresses, A and B, may be used to address individual ones of four sections of a memory or other component. For example, a conventional address decoder may interpret an address in which A is 0 and B is 1 as addressing section 2 of the memory.

TABLE 1

| Addressing 1 of 4 Sections | | |
|---|---|---|
| Address | | |
| A | B | Section Addressed |
| 0 | 0 | 1 |
| 0 | 1 | 2 |
| 1 | 0 | 3 |
| 1 | 1 | 4 |

Table 2 below illustrates how two of four sections of the memory may be addressed. For example if B is 0 then sections 1 and 3 are addressed, with the particular section being determined by the state of the A bit. The six different address states shown in Table 2 serve to uniquely address the six possible partial products P1 to P6, each of 32k bits formed by pairs of sections of a 64k bit memory.

TABLE 2

| | Addressing 2 of 4 Sections | | |
|---|---|---|---|
| Product # | Address | | Sections Addressed |
| P1 | A = 0 | B = X | 1,2 |
| P2 | A = 1 | B = X | 3,4 |
| P3 | A = X | B = 0 | 1,3 |
| P4 | A = X | B = 1 | 2,4 |
| P5 | A = B | | 1,4 |
| P6 | A = $\overline{B}$ | | 2,3 |
| | (where X = 0 or 1) | | |

Figure 1:
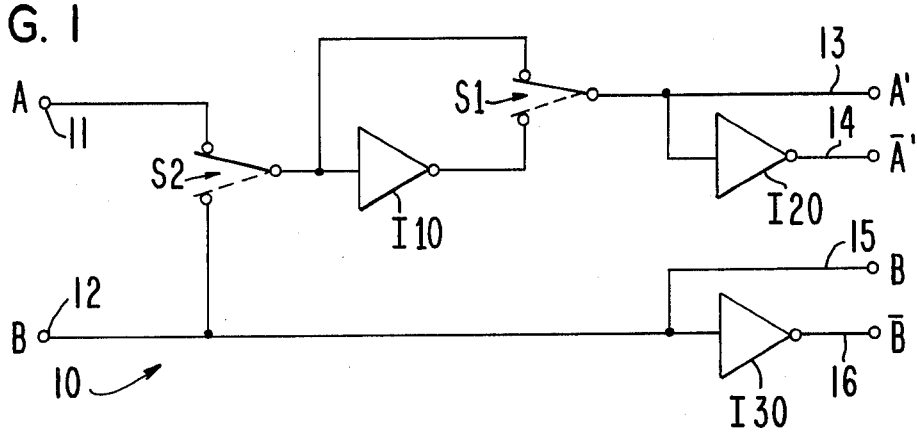
FIG. 1 is logic diagram of a programmable address buffer suitable for addressing four different partial products in a device containing six potential partial products.
Figure 2:
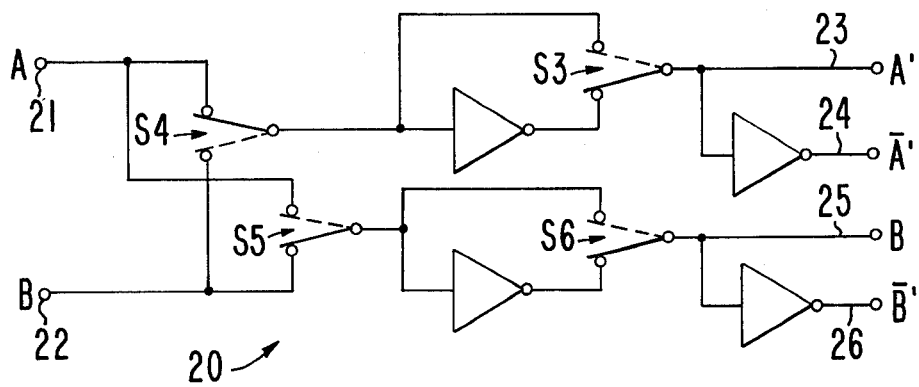
FIG. 2 is a logic diagram of a programmable address buffer suitable for addressing each partial product in a memory containing six partial products.

FIG. 1 illustrates a two switch programmable address buffer which couples between two external address inputs 11 and 12 and four internal address lines 13, 14, 15 and 16. As will be explained, by suitably programming the state of programmable switches S1 and S2, any one of four of the six possible partial products (each partial product itself comprising two 16K bit sections) listed in Table 2 may be coupled to pins A and B. Furthermore, the addressing necessary for any of these four partial products will be independent of the particular sections coupled to address inputs 11 and 12. If all six partial products are required to yield one functional 32k product then a four switch programmable address buffer such as depicted in FIG. 2 will be used.

In FIG. 1 the normal positions of switch S1 and S2 are depicted in solid lines, while the programmed positions are depicted by dashed lines. With switches S1 and S2 in their normal position, an output address A will appear on line 13, address $\overline{A}$ on line 14, address B on line 15, and address $\overline{B}$ on line 16. For the embodiment shown in FIG. 1, the external address supplied to the A terminal 11 will always be zero, and is called partial P1 as shown in Table 2. Thus with the switches in their normal position, sections 1 and 2 of the four sections of the memory will be addressed with the particular one of sections 1 and 2 selected being dependent upon the state of the B address input. The normal condition is shown in line 1 of Table 3 below.

If switch S1 is moved to the programmed position, then the A address from terminal 11 will be inverted by inverter I10 and therefore $\overline{A}$ will be supplied to line 13, while inverter I20 will cause an A address to be supplied to line 14. Because the A address input supplied to terminal 11 is always 0, the output on line 13 will be 1, thereby selecting sections 3 and 4 of the memory, with the particular one of those sections addressed being determined by the state of the B address input. This is shown in line 2 of Table 2.

If switch S1 is left in the normal position and switch S2 is changed to the programmed position, then the input address B supplied to terminal 12 will appear on line 13 and on line 15. Because the state of line 13 will therefore always be the same as the state of line 15, the A=B address shown in Table 2 will result, and sections 1 and 4 of the memory will be addressed as shown in line 3 of Table 3.

In a similar manner with both switches S1 and S2 in their programmed positions, the address A=$\overline{B}$ shown in Table 2 will appear on lines 13 and 16, and partial product P6 (sections 2 and 3) of the memory will be addressed as shown in line 4 of Table 3.

TABLE 3

| Partial Product | Switch Programmed |
|---|---|
| P1 | None |
| P2 | S1 |
| P5 | S2 |
| P6 | S1 and S2 |

FIG. 2 is a schematic diagram of a four switch programmable address buffer 20 which operates in a similar fashion to address buffer 10. Buffer 10 allowed the B input 12 to be supplied to lines 13 and 14. Buffer 20 allows this to occur, and allows the A input to terminal 21 to be supplied to lines 25 and 26, thereby enabling the address condition shown lines 3 and 4 of Table 2 to be created, and consequently enabling the addressing of sections 1 and 3 or sections 2 and 4. These pairs of sections could not be addressed using the address buffer 10 shown in FIG. 1.

Figure 3:
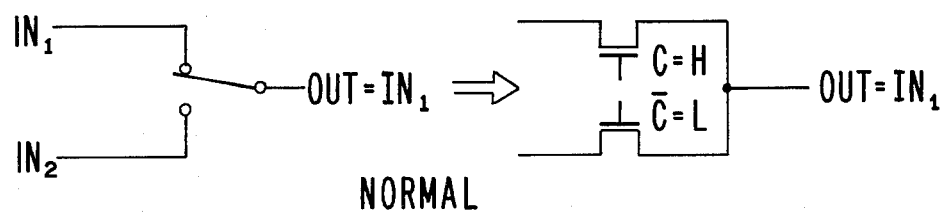
FIG. 3 illustrates two states of a programmable switch used in FIGS. 1 and 2.
Figure 3:
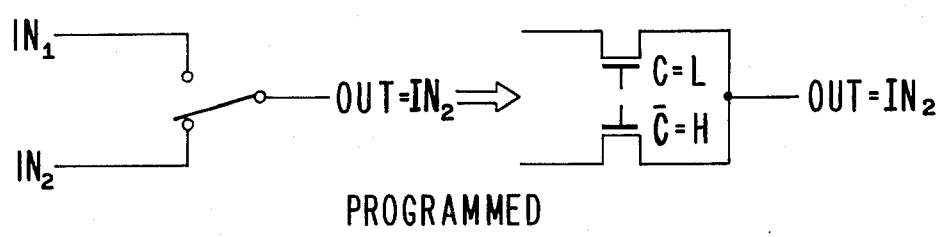
Figure 5:
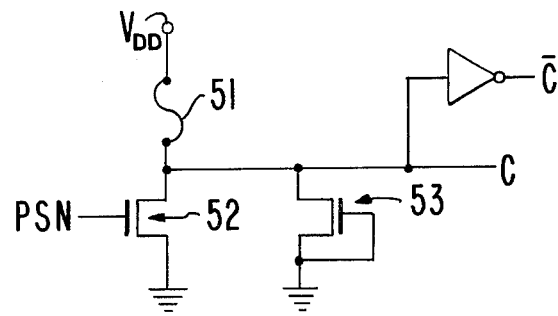
FIG. 5 is a circuit schematic of one embodiment of a programmable fuse for generating a control signal.

FIG. 3 illustrates a first embodiment of the programmable switches shown in FIGS. 1 and 2, in which the programmable switches use two MOS transistors. The control signal C supplied to the two MOS transistors shown in FIG. 3 may be generated using the circuit shown in FIG. 5. As shown by FIG. 5 the control signal C is normally high, and therefore $\overline{C}$ is normally low. After the fuse 51 is blown, signal C and $\overline{C}$ reverse their logic levels. In this manner the switching action depicted in FIG. 3 is achieved.

Figure 4:
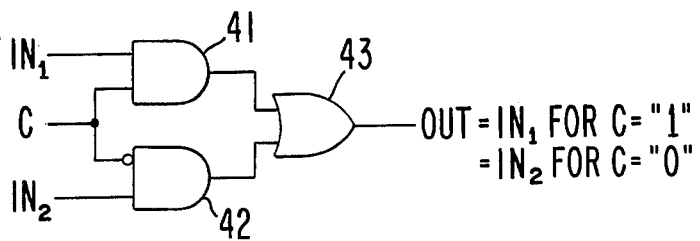
FIG. 4 is a logic diagram corresponding to the switch shown in FIG. 3.

FIG. 4 is a logic gate implementation of the programmable switches shown in FIGS. 1 and 2. The logic gate shown in FIG. 4 includes first and second AND gates 41 and 42, and OR gate 43. As shown by FIG. 4 the output from the logic gate structure will be signal IN1 if C is 1 and signal IN2 if C is 0.

The control signal generator shown in FIG. 5 is controlled by a programming signal PSN supplied to transistor 52. The programming signal PSN goes to a high level whenever the switch is programmed, thereby causing signal C to switch from high to low. Transistor 53 is a depletion device bleeder. This signal generator is shown in "Memories and Redundancy Techniques," by K. Kokkonen et al., 1981 *Digest of Technical Papers of International Solid State Circuits Conference*, p. 80–81.

Figure 6:
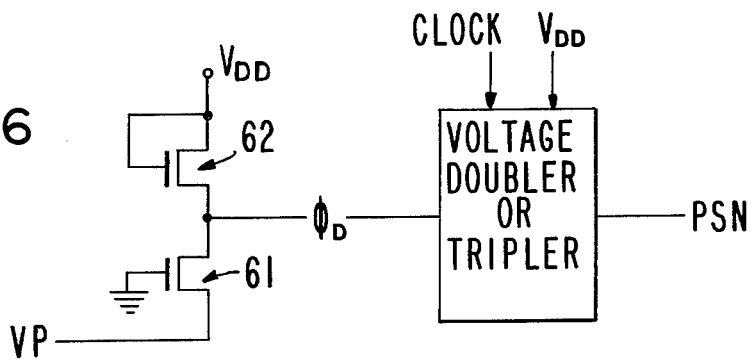
FIG. 6 is a circuit schematic of one technique for generating a programming signal for the programmable switch.

FIG. 6 illustrates one technique for generating programming signal PSN from a negative programming voltage VP supplied to transistor 61 as shown. This negative voltage causes $\phi_D$ to be high if VP is within normal operating conditions and $\phi_D$ to be low if VP is below ground by more than a threshold voltage.

Figure 7:
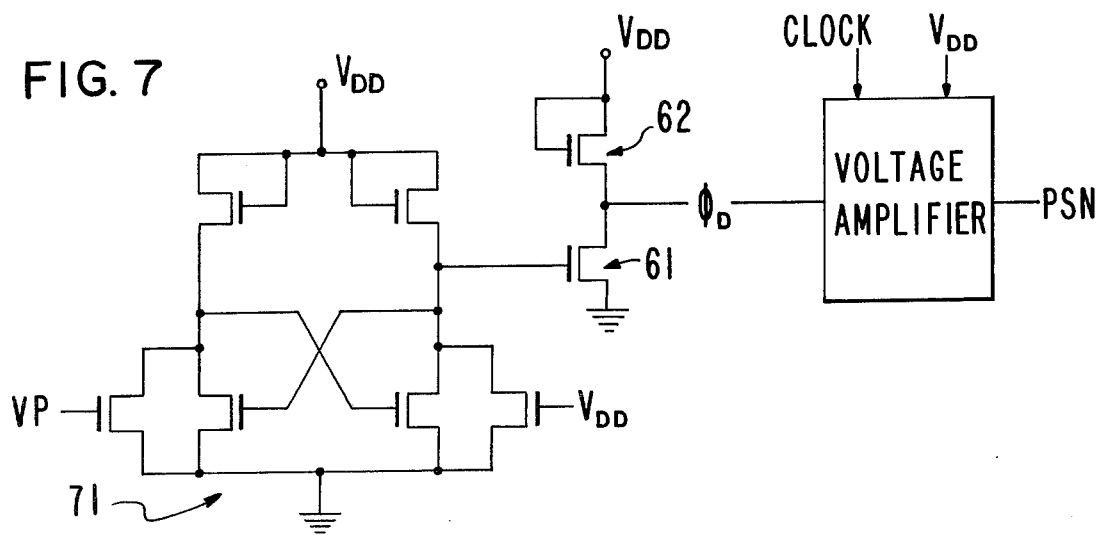
FIG. 7 illustrates another technique for generating the programming signal.

FIG. 7 is a schematic illustrating how the programming signal PSN may be achieved using a programming voltage level which is higher than $V_{DD}$ by the minimum voltage needed to trigger the flip-flop 71 shown. The programming voltage VP may be supplied through external pins connected to the chip. Because either a high or low programming voltage may be used, depending upon which of the particular embodiments of FIGS. 6 and 7 is selected, the same pin used for programming may also be used for other purposes in which the normal signal range does not reach the level necessary to trigger programming.

Figure 8:
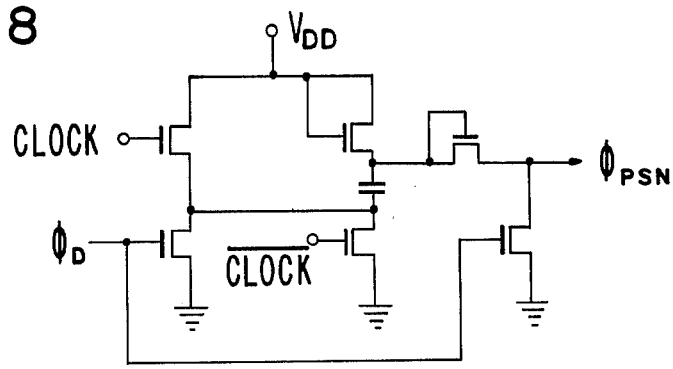
FIG. 8 illustrates a voltage doubler.

FIG. 8 is an electrical schematic of a well-known simple voltage doubler or amplifier which may be used in conjunction with the apparatus shown in FIGS. 6 and 7.

Figure 9:
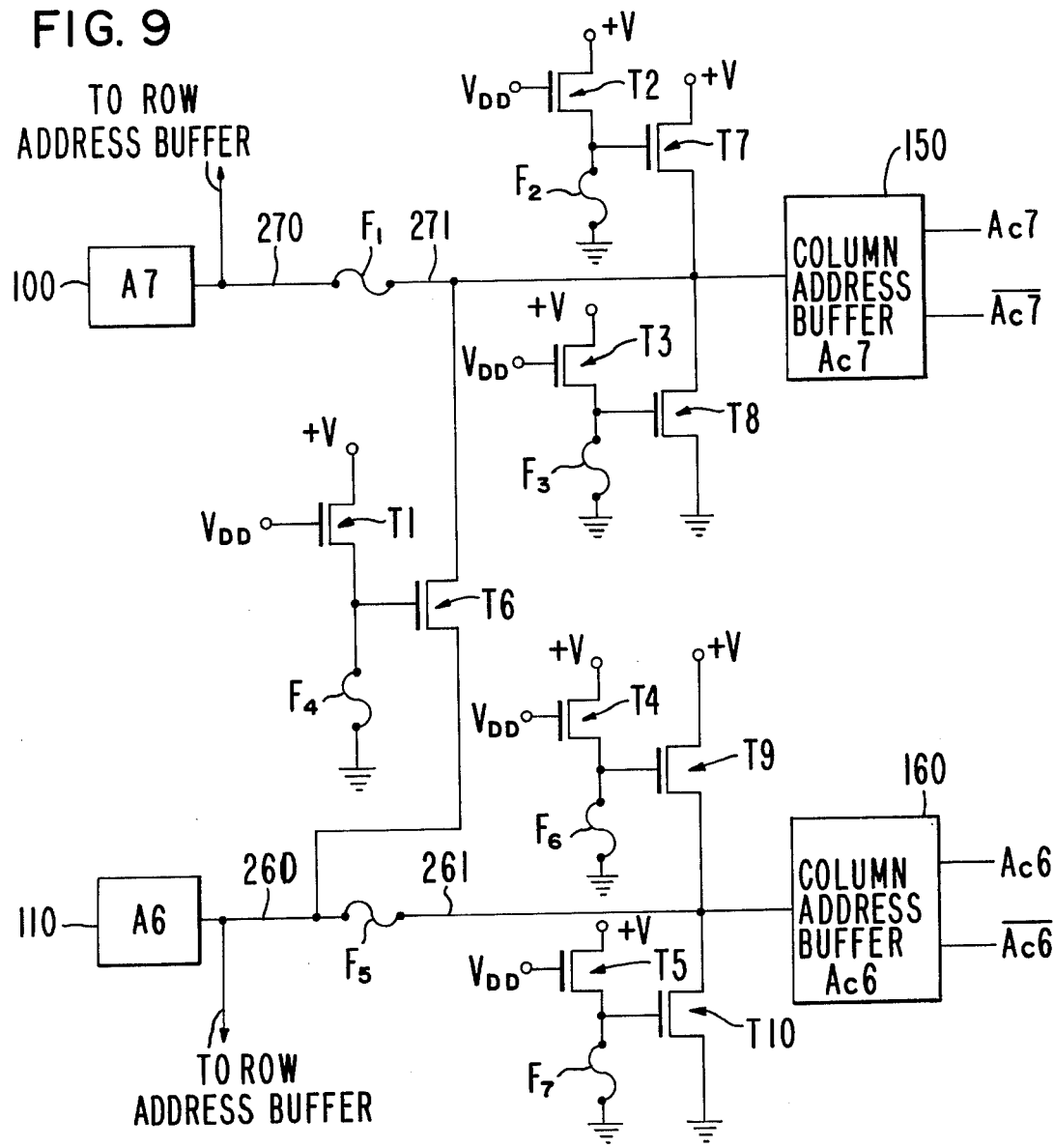
FIG. 9 is an electrical schematic of the preferred embodiment of the invention.

FIG. 9 is an electrical schematic of a preferred embodiment of a circuit to implement this invention in the manner described above. As shown in FIG. 9 the circuit is implemented between the bonding pads 100 and 110 and internal column address buffers 150 and 160. The bonding pads are the regions on the periphery of the integrated circuit to which electrical connections may be made to a package containing the integrated circuit. As shown schematically in FIG. 9 bonding pad 100 is connected both to an internal column address buffer 150 and to a row address buffer (not shown). Bonding pad 110 is similarly connected. The particular circuit shown in FIG. 9 includes 10 transistors T1–T10 and fuses F1–F7 as shown. Transistors T1 through T5 may be depletion or enhancement mode transistors and their gates may be connected to a clock signal or to $V_{DD}$, or to their sources. The geometry of transistors T1 through T5 will be made as small as possible to provide some leakage current to maintain a higher voltage on the gates of transistors T6 through T10, when the appropriate fuses are blown.

As shown, line 271 extending between fuse F1 and address buffer 150 may be selectively coupled to positive voltage +V through transistor T7 or to ground through transistor T8. A transistor T6 has its source and drain connected between lines 260 and 271, with the gate of transistor T6 being controlled by transistor T1 and fuse F4. Similarly, the connection 261 extending between fuse F5 and address buffer 160 may also be coupled to a positive voltage through transistor T9 or to ground through transistor T10.

In the preferred embodiment the fuses are designed to be "blown" using a laser, for example, in the manner shown in "Cost-Effective Yield Improvement in Fault-Tolerant VLSI Memory," by J.F.M. Bindels 1981 *Digest of Technical Papers of International Solid State Circuits Conference*, pages 82 and 83.

Table 4 below summarizes the particular fuses to be blown to achieve a half-density memory from a desired half density partial product. For example, as shown in line 1 of Table 4, if sections 1 and 3 are to be selected fuses F1 and F3 are blown. The opening of fuse F1 effectively disconnects bonding pad 100 from address buffer 150. Opening fuse F3 connects the Ac7 address buffer to ground through transistor T8, thereby holding the internal address buffer 150 at a "0" state. In this manner the partial product in which column address Ac7 is zero is converted to a 32k memory with the selection of a section being determined by the address supplied to pad 110.

As correspondingly shown in line 2 of Table 4 if sections 2 and 4 of the memory are functional, then fuses F1 and F2 are blown. In this manner the internal column address buffer 150 will always be connected to +V through transistor T7 thereby creating a "1" state for buffer 150.

If sections 1 and 2 of the memory are functional and to be selected for a partial product, then fuses F1, F4, F5, and F7 are all blown. The opening of fuses F1 and F5 disconnects pad 100 from buffer 150 and pad 110 from buffer 160. Opening fuse F7 causes buffer 160 to be connected to ground through transistor T10, thereby generating a zero state for address buffer 160. Opening F4 causes transistor T6 to remain on, and thereby connects line 271 to line 260 and thereby allows the state of buffer 150 to be controlled by the address supplied to pad 110.

The opening of fuses F1, F4, F5, and F6 result in the selection of sections 3 and 4 of the memory. Opening these fuses causes address buffer 160 to supply only a "1", while allowing the state of buffer 150 to be controlled by the signal applied to pad 110. Finally, by blowing only fuses F1 and F4 pad 100 will be disconnected from the remainder of the circuit and transistor T6 will always be on. Thus the state of address buffers 150 and 160 will always be the same and depend upon the signal applied to pad 110.

TABLE 4

| Partial Product | Sections Selected | Fuse(s) Blown | Internal Address Ac7 | Ac6 |
|---|---|---|---|---|
| (1) Ac7 = 0 | 1,3 | $F_1 F_3$ | 0 | Ac6 |
| (2) Ac7 = 1 | 2,4 | $F_1 F_2$ | 1 | Ac6 |
| (3) Ac6 = 0 | 1,2 | $F_1 F_4 F_5 F_7$ | Ac6 | 0 |
| (4) Ac6 = 1 | 3,4 | $F_1 F_4 F_5 F_6$ | Ac6 | 1 |
| (5) Ac7 = Ac6 | 1,4 | $F_1 F_4$ | Ac6 | Ac6 |

This invention converts a group of different partial products into a single half density product having individual sections whose addressing is "transparent" to the user of the product. The circuit described does not influence product speed, while increasing power consumption and circuitry only negligibly. It greatly simplifies application of the memory or other product with which it is used because a half density product is achieved. The user is free to provide either "1" or "0" as address Ac7 without affecting the addressing of the memory.

The partial memory selection addressing scheme of this invention may be implemented with any product and technology without requirement of any additional pins. Programming of the appropriate address buffers may be achieved before the die are separated from the wafer, or after packaging. The invention enables the fabrication of a single lower density memory from a multiple of partial products taken from a higher density memory product.

Although several embodiments of this invention have been described above, these embodiments are intended to illustrate the invention, rather than limit it. The scope of the invention may be ascertained from the appended claims.

I claim:

1. Apparatus for addressing two portions of a circuit containing at least four portions comprising:
   an A address input;

a B address input;

a B address output coupled to the B address input;

a first inverter coupled to the B address input and to a $\bar{B}$ address output;

first switch means coupled to switchably connect only one of the A and B address inputs to a first node;

a second inverter connected to the first node;

second switch means coupled to switchably connect one of the first node or the second inverter to a second node;

an A address output coupled to the first node; and an $\bar{A}$ address output coupled through a third inverter to the second node.

2. Apparatus as in claim 1 wherein each of the first and second switch means comprises first and second MOS transistors.

3. Apparatus as in claim 2 wherein each of the MOS transistors includes a source, a drain, and a gate.

4. Apparatus as in claim 3 wherein one of the source and drain of the first transistor is connected to one of the source and drain of the second transistor and coupled to an output terminal.

5. Apparatus as in claim 4 wherein a first input signal is supplied to the other of the source and drain of the first transistor, and a second input signal is supplied to the other of the source and drain of the second transistor.

6. Apparatus as in claim 5 wherein control signals are applied to the gates of each of the MOS transistors.

7. Apparatus as in claim 1 wherein each of the first and second switch means comprises:

a first AND gate to which a control signal and a first input are supplied;

a second AND gate to which a second input signal and the inverse of the first control signal are supplied; and a OR gate having as inputs an output from each of the first and second AND gate, and being coupled to an output terminal.

8. Apparatus for addressing any two portions of at least four portions of a circuit comprising:

an A address input;

a B address input;

first switch means coupled to switchably connect one of the A or B address inputs to a first node;

second switch means coupled to switchably connect one of the A or B address inputs to a second node;

third switch means coupled to switchably connect one of the first node or a third node to an A address output;

fourth switch means coupled to switchably connect one of the second or a fourth node to a B address output;

a first inverter coupled between the first and third nodes;

a second inverter coupled between the second and fourth nodes;

a third inverter coupled between the third node and an $\bar{A}$ address output; and a fourth inverter coupled between the fourth node and an $\bar{B}$ address output.

9. Apparatus as in claim 8 wherein each of the first, second, third and fourth switch means comprises MOS transistors.

10. Apparatus as in claim 8 wherein each of the first, second, third and fourth switches comprises:

a first AND gate to which a control signal and a first input are supplied;

a second AND gate to which a second input signal and inverse of the first control signal are supplied; and a OR gate having as inputs, an output from each of the first and second AND gate, and being coupled to output terminal.

11. Apparatus for controlling the addressing of two of at least four sections of a circuit comprising:

a first pin coupled by first fusing means to a first address buffer;

a second pin coupled by second fusing means to a second address buffer;

means for electrically connecting each of the first and second address buffers to selected potentials; and means for electrically connecting the second pin to the first address buffer.

12. Apparatus as in claim 11 wherein the selected potentials comprise two different potentials.

13. Apparatus as in claim 12 wherein the means for eletrically connecting each address buffer to one of the two selected potentials comprises:

a first fusible connection between the address buffer and the first potential; and a second fusible connection between the address buffer and the second potential.

14. Apparatus as in claim 13 wherein the means for electrically connecting each address buffer to the other comprises a third fusible connection.

15. Apparatus as in claim 14 wherein the means for electrically connecting each address buffer to one of the selected potentials comprises a first MOS transistor having source and drain connected between the selected potential and the address buffer.

16. Apparatus as in claim 15 wherein a gate of the MOS transistor is coupled to a node between fusing means and a second MOS transistor.

17. Apparatus as in claim 16 wherein one of the source and drain and the gate of the second MOS transistor are coupled to a source of electrical signals.

18. Appparatus as in claim 17 wherein a fuse is coupled between ground and the node.

* * * * *